United States Patent
Kosuda et al.

(10) Patent No.: US 6,843,883 B2
(45) Date of Patent: Jan. 18, 2005

(54) VACUUM PROCESSING APPARATUS AND METHOD FOR PRODUCING AN OBJECT TO BE PROCESSED

(75) Inventors: Masanori Kosuda, Tokyo (JP); Yoshihisa Tamagawa, Tokyo (JP); Hideki Ishizaki, Tokyo (JP)

(73) Assignee: TDK Corporation, Tokyo (JP)

(*) Notice: Subject to any disclaimer, the term of this patent is extended or adjusted under 35 U.S.C. 154(b) by 30 days.

(21) Appl. No.: 10/230,178

(22) Filed: Aug. 29, 2002

(65) Prior Publication Data

US 2003/0051815 A1 Mar. 20, 2003

(30) Foreign Application Priority Data

Aug. 31, 2001 (JP) ........................... 2001-264193

(51) Int. Cl.[7] ............... C23C 16/000; H01L 21/000; B65G 49/07
(52) U.S. Cl. ................. 156/345.32; 156/345.31; 156/345.29; 118/719; 414/939; 204/298.25; 204/298.27; 204/298.35
(58) Field of Search ............... 156/345.31, 345.32; 118/719; 204/298.25, 298.26; 414/939; 417/540; 138/26

(56) References Cited

U.S. PATENT DOCUMENTS

| 4,675,096 A | | 6/1987 | Tateishi et al. | |
|---|---|---|---|---|
| 4,699,585 A | * | 10/1987 | Giese et al. | 425/522 |
| 4,824,545 A | * | 4/1989 | Arnold et al. | 204/298.25 |
| 5,433,785 A | * | 7/1995 | Saito | 118/719 |
| 6,074,202 A | * | 6/2000 | Yagi et al. | 432/11 |
| 2003/0102084 A1 | * | 6/2003 | Livesay et al. | 156/345.31 |

FOREIGN PATENT DOCUMENTS

| DE | 4401718 C1 | | 8/1975 | |
|---|---|---|---|---|
| JP | 58078357 A | * | 5/1983 | H01J/37/315 |
| JP | 01050414 A | * | 2/1989 | H01L/21/205 |
| JP | 02081457 A | * | 3/1990 | H01L/21/68 |
| JP | 08-097126 | | 8/1996 | |
| JP | 2000-313959 | | 11/2000 | |

* cited by examiner

Primary Examiner—Parviz Hassanzadeh
Assistant Examiner—Karla Moore
(74) Attorney, Agent, or Firm—Oliff & Berridge, PLC (57) ABSTRACT

A vacuum processing apparatus 50 is provided with a bypass line 52 for causing a vacuum transfer chamber 4 and a load-lock chamber 12 to communicate with each other, and a bypass opening and shutting valve 54 for opening and shutting the corresponding bypass line 52, wherein by opening the bypass opening and shutting valve 54, a pressure-reduced state at the vacuum transfer chamber 4 side can be shifted to the load-lock chamber 12 side, and the pressure reduction of the load-lock chamber 12 can be carried out in a short time.

8 Claims, 4 Drawing Sheets

VACUUM PROCESSING APPARATUS AND METHOD FOR PRODUCING AN OBJECT TO BE PROCESSED

BACKGROUND OF THE INVENTION

1. Field of the Invention

The present invention relates to a vacuum processing apparatus that carries out prescribed processing on the surface of an object to be processed, in a vacuum state.

2. Description of the Prior art

Conventionally, for example, in a production process of optical discs or a production process of liquid crystal display panels, in order to execute surface processes such as spattering, etching, baking or ashing with respect to objects to be processed in a vacuum state, a vacuum processing apparatus provided with a plurality of vacuum processing chambers has been widely used (For example, Japanese Unexamined Patent Publication No. 2000-313959).

Figure 5:
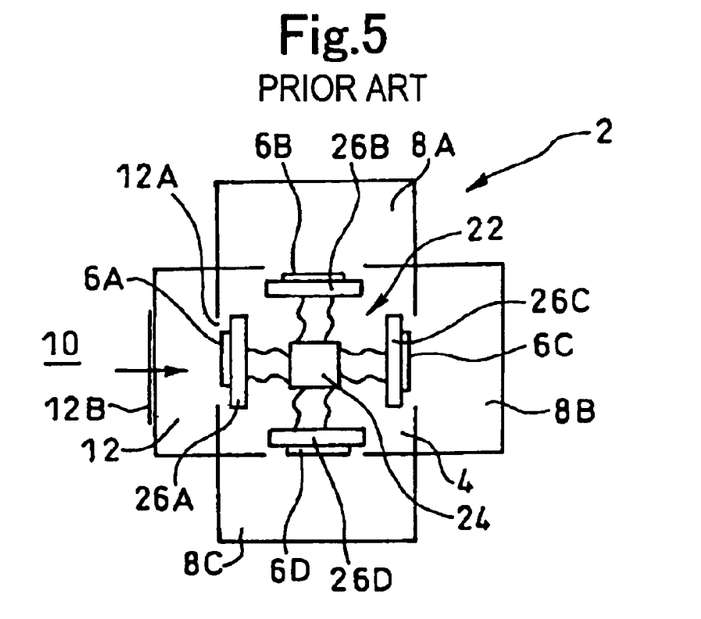
FIG. 5 is a roughly fragmentary cross-sectional view schematically showing a prior art vacuum processing apparatus.
Figure 6:
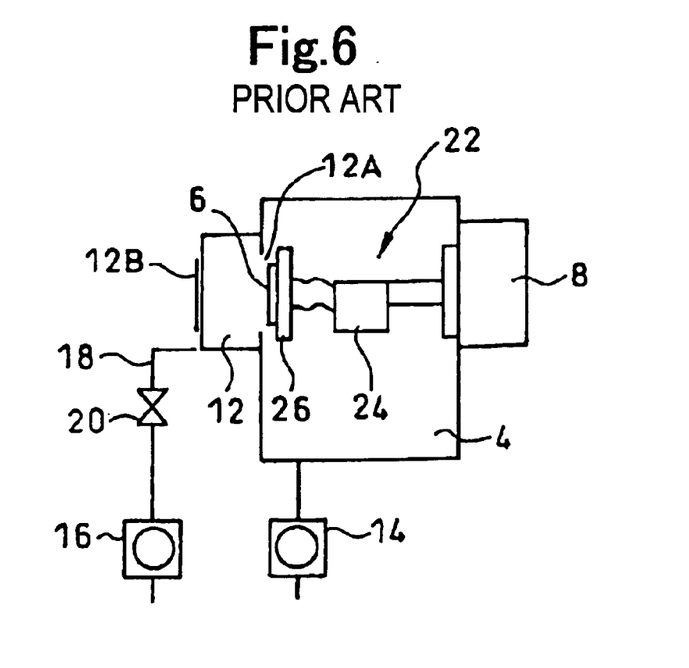
FIG. 6 is a roughly virtical sectional view of the above-described prior art vacuum processing apparatus.

FIG. 5 and FIG. 6 show one example of a prior art vacuum processing apparatus, respectively, wherein FIG. 5 is a plan view thereof while FIG. 6 is a longitudinally sectional view thereof.

The vacuum processing apparatus 2 is provided with a vacuum transfer chamber 4, vacuum processing chambers 8 (8A through 8C) that, in a pressure-reduced state, carry out prescribed surface processing (film formation) on discs 6 (6A through 6D) being an object to be processed, and a load-lock chamber 12 that receives and transfers the discs 6 between the outside 10 and the vacuum transfer chamber 4.

The vacuum transfer chamber 4 is maintained so that the interior thereof can be maintained in a vacuum state or in a pressure-reduced state (hereinafter merely called a "pressure-reduced state") by a first pump 14. A turbo-molecular pump (TMP), etc., may be generally used as the first pump 14, wherein high vacuum P1 of $10^{-4}$ Pa or so can be maintained in the vacuum transfer chamber 4.

The above-described vacuum processing chambers 8 (8A through 8C) are provided in a plurality (in the drawing, three chambers) so as to communicate with or be isolated from the vacuum transfer chamber 4, wherein prescribed surface processing such as spattering, etc., is carried out on the discs 6 which are objects to be processed.

The above-described load-lock chamber 12 is constructed so that the interior pressure thereof is reduced from the atmospheric pressure by a second pump 16. An oil-sealed rotary pump, etc., which can be used from the atmospheric pressure, maybe generally used as the second pump 16, wherein the interior pressure of the load-lock chamber 12 can be reduced from the atmospheric pressure to a pressure-reduced state (medium vacuum state) P2 of several Pa.

A transfer mechanism 22 for transferring the discs 6, which are the objects to be processed, is provided in the vacuum transfer chamber 4. The transfer mechanism 22 is composed of a rotating table 24 and a disc transfer carrier 26 that is able to hold and transfer the discs 6 attached to the corresponding rotating table 24 so as to advance and retreat. The disc transfer carrier 26 concurrently acts as an opening and shutting valve between the load-lock chamber 12 and the respective vacuum processing chambers 8 (8A through 8C) and the above-described vacuum transfer chamber 4.

When a disc 6 is conveyed from an outside 10 into the load-lock chamber 12, a second opening portion 12B at the outside 10 side is opened with a first opening portion 12A with the vacuum transfer chamber 4 side closed, and the disc 6 is conveyed from the outside 10 into the load-lock chamber 12. The orientation of the conveyed disc 6 is turned by a rotating mechanism (not illustrated), and the disc 6 is directly held by the disc transfer carrier 26.

Also, in the meantime, the second pump 16 still continues its rotation, and an air opening and shutting valve 20 interrupts an air line 18.

After that, the second opening portion 12B at the outside 10 side is shut, and at the same time, the air opening and shutting valve 20 is opened, wherein the interior pressure of the load-lock chamber 12 is reduced from the atmospheric pressure to a prescribed pressure-reduced state (medium vacuum state) P2. As the pressure reduction is completed, all the disc transfer carriers 26 retreat to the rotating table 24 side, and in this state, the rotating table 24 turns by 90 degrees in the horizontal direction. If the respective disc transfer carriers 26 are caused to advance after the rotating table 24 is turned, the load-lock chamber 12 and the respective vacuum processing chambers 8 are interrupted (isolated) again from the vacuum transfer chamber 4 (in a state where the held discs 6 are, respectively, moved to the adjacent chambers). After being interrupted, the air opening and shutting valve 20 is shut, the processed discs 6 (discs turned in the order from 6D to 6A) are discharged to the outside 10 by a rotating mechanism in the load-lock chamber 12. And, new unprocessed disc 6 (6A) is mounted in the disc transfer carrier 26.

As a result, the disc 6 is conveyed into the vacuum transfer chamber 4 and carried out therefrom via the load-lock chamber 12 in a state where the reduced pressure (high vacuum state) P1 in the vacuum processing chambers 8 is maintained.

In such a prior art vacuum processing apparatus 2, the interior pressure of the load-lock chamber 12 is reduced to a prescribed pressure-reduced state P2 by only the second pump 16, using a considerably long period of time (T1). At this stage, the disc transfer carrier 26 is caused to retreat, and the first opening portion 12A is opened, wherein the discs 6 are transferred.

If the first opening portion 12A is opened since the prescribed pressure-reduced state P2 is considerably higher than the pressure P1 of the vacuum transfer chamber P1, the pressure of the vacuum transfer chamber 4 and the respective vacuum processing chambers 8 connected thereto is accordingly raised.

For this reason, since there is a fear that an adverse effect due to an increase in pressure particularly after the processing in respective vacuum processing chambers 8 is given to quality, it was necessary to cause the disc transfer carrier 26 to standby in a state where the disc transfer carrier 26 is retreated to the rotating table 24 side or before commencing the processing in the processing chambers. Therefore, a long cycle time was required.

Generally, in order to secure the quality of a surface treatment of an object to be processed, in this type of vacuum processing apparatus, (1) the pressure of the vacuum processing chambers is maintained to be low in the vacuum processing chamber, (2) the remaining gas is quickly exhausted smoothly, or (3) in order to prevent the quality of the objects to be processed from being lowered immediately after the surface processing, it is necessary that the above-described pressure is devised so that the pressure is raised as little as possible in the vacuum transfer chamber. On the other hand, (4) it becomes another important object to shorten the cycle time.

In view of increasing the basic performance of the pump, a considerable effect can be recognized with respect to any one of the above objects. This is directly connected to an increase in costs. If the discharge time is set longer even in a case where the same pump is used, an effect can be recognized in the above-described points (1) through (3). However, this reverses the effect with respect to shortening of the cycle time.

In connection with point (3), prior to causing the load-lock chamber and the vacuum transfer chamber to communicate with each other, it is effective to reduce the pressure of the load-lock chamber to a pressure-reduced state close to that of the vacuum transfer chamber in advance. However, herein, a concrete problem arises.

That is, in this type of vacuum processing apparatus, the load-lock chamber is temporarily returned to the atmospheric pressure once every cycle due to its construction. At this moment, no wide-range pump has been developed, which is able to reduce the pressure from the atmospheric pressure to a pressure-reduced state at a level required for the vacuum transfer chamber by a single unit in a short time such as several seconds. Therefore, even if the pressure is reduced with a longer period of time taken, the pressure cannot be reduced to a pressure-reduced state at a level required for the vacuum transfer chamber due to shortage in the performance of a pump.

Therefore, in order to lower the pressure of the load-lock chamber to a pressure-reduced state at a level required for the vacuum transfer chamber, at present, at least two types (two units) of second pumps are required, wherein it is unavoidable to remarkably increase costs and to increase the area of occupancy.

Furthermore, if the object of making the discharge of the remaining gas smooth in point (2) is taken into consideration, the problem is further complicated.

"Remaining gas" is the general term of gases emitted from the wall surface of the vacuum processing chambers and vacuum transfer chamber, substrates of objects to be processed, and formed film layers, etc. In a narrow sense, the remaining gas means an "adverse remaining gas", which adversely influences the quality of the surface processing, among the above. The remaining gas can be qualitatively decreased by lowering the pressure. However, the remaining gas cannot be smoothly decreased by only control of the pressure. If the remaining gas is increased, the quality of products will be resultantly worsened. Recently, this has become a serious problem as one of the issues concerning this type of apparatus.

SUMMARY OF THE INVENTION

The present invention was developed in order to solve such conventional problems, and it is therefore an object of the invention to provide a vacuum processing apparatus that is able to maintain the pressure of the vacuum transfer chamber at a low level without accompanying a large increase in the costs thereof, has high exhaust(purge) performance of a remaining gas, and is able to shorten the cycle time of respective processes.

The present invention solves the above-described problems by inventing a vacuum processing apparatus according to the construction described in the following point (1).

(1) A vacuum processing apparatus is featured in that the same includes: a vacuum transfer chamber whose interior can be maintained in a vacuum state or a pressure-reduced state; a plurality of vacuum processing chambers that are disposed adjacent to the above-described vacuum transfer chamber so as to communicate therewith or be isolated therefrom, and carry out prescribed processing on an object to be processed, in a vacuum state or a pressure-reduced state; a load-lock chamber, the interior pressure of which is reduced from the atmospheric pressure, that carries out receiving and transfer of the above-described object to be processed, between the outside and the above-described vacuum transfer chamber; and a transfer mechanism, which is provided in the above-described vacuum transfer chamber, receives the above-described object to be processed from the above-described load-lock chamber, and transfers the above-described object to be processed into the above-described plurality of vacuum processing chambers, and at the same time, moves the above-described object to be processed into the above-described load-lock chamber after prescribed processing is completed; and further comprises: a bypass line for connecting the above-described vacuum transfer chamber to the above-described load-lock chamber; a bypass valve for opening and shutting the above-described bypass line; a first opening and shutting valve for opening and shutting between the above-described load-lock chamber and the above-described vacuum transfer chamber; and a second opening and shutting valve for opening and shutting between the above-described vacuum processing chambers and the above-described vacuum transfer chamber; wherein, when the atmospheric pressure in the above-described load-lock chamber is reduced to a prescribed stage with the above-described first opening and shutting valve closed, the above-described load-lock chamber and the above-described vacuum transfer chamber are caused to communicate with each other by the above-described bypass valve and the above-described bypass line in a state where the above-described vacuum processing chambers are isolated from the above-described vacuum transfer chamber by the above-described second opening and shutting valve.

In the invention, the load-lock chamber is caused to communicate with the vacuum transfer chamber, whereby reduction of the pressure of the load-lock chamber can be accelerated.

The above-described construction does not require any new pump system at all, and does not need any highly efficient pump, wherein it is possible to suppress the costs thereof.

Also, since a reduced state of the vacuum transfer chamber is transmitted to the load-lock chamber in a remarkably short time, the time required for reduction of pressure in the corresponding load-lock chamber can be shortened to a large extent. Since the pump for the vacuum transfer chamber has a larger capacity than that of the pump for the load-lock chamber, the total cycle time can be shortened because the pump for the vacuum transfer chamber can be used quickly.

In addition, since the pressure of the load-lock chamber can be lowered to a low-pressure level without preparing two types of pumps and the difference in pressure is small, stability of the pressure-reduced state in the vacuum transfer chamber can be improved.

A pressure rise in the vacuum transfer chamber due to communication of the bypass line does not influence the vacuum processing chamber side (because the vacuum processing chambers are isolated from the vacuum transfer chamber. Therefore, stabilized surface processing in a pressure-reduced state can be continued in the vacuum processing chambers as it is.

Further, since it is possible to cause a larger amount of air to flow into the vacuum transfer chamber by virtue of communication of the bypass line than in the prior arts, the remaining gases can be efficiently exhausted together with the flown air (described in detail later).

Also, the following constructions can be considered as variations of the invention. The details thereof will be described later.

(2) The vacuum processing apparatus according to (1) is featured in that, at the stage where the pressure of the above-described load-lock chamber reaches prescribed pressure required for the above-described vacuum transfer chamber after the above-described bypass valve is opened, the above-described second opening and shutting valve is opened so as to clear a state where the above-described vacuum processing chambers are isolated from the above-described vacuum transfer chamber.

(3) The vacuum processing apparatus according to (1) is featured in that, at the stage where time considered for which the pressure of the above-described load-lock chamber reaches pressure required for the above-described vacuum transfer chamber elapses after the above-described bypass valve is opened, the above-described second opening and shutting valve is opened so as to clear a state where the above-described vacuum processing chambers are isolated from the above-described vacuum transfer chamber.

(4) The vacuum processing apparatus according to (1) is featured in that, immediately after prescribed processing is completed in the above-described vacuum processing chambers after the above-described bypass valve is opened, the above-described second opening and shutting valve is opened so as to clear a state where the above-described vacuum processing chambers are isolated from the above-described vacuum transfer chamber.

(5) The vacuum processing apparatus according to (1) is featured in that, at the stage where time considered for which prescribed processing is completed in the above-described vacuum processing chambers elapses after the above-described bypass valve is opened, the above-described second opening and shutting valve is opened so as to clear a state where the above-described vacuum processing chambers are isolated from the above-described vacuum transfer chamber.

(6) The vacuum processing apparatus according to any one of (1) to (5) is featured in that the above-described transfer mechanism is mainly composed of a rotating table and a plurality of transfer carriers of the object to be processed that are attached to the above-described rotating table so as to freely advance and retreat, and are able to hold and transfer the above-described object to be processed, and the above-described transfer carriers concurrently act as the above-described first and second opening and shutting valves.

(7) The vacuum processing apparatus according to any one of (1) to (6) is featured in further comprising: a second bypass line for causing a specified vacuum processing chamber of the above-described plurality of vacuum processing chambers to communicate with the above-described load-lock chamber; and a second bypass valve for opening and shutting the above-described second bypass line; wherein the above-described second bypass valve is opened after the above-described bypass line is opened so as to clear the above-described second bypass line is caused to communicate with the above-described load-lock chamber.

(8) The vacuum processing apparatus according to any one of (1) to (7) is featured in that an opening and shutting valve for opening and shutting an air line between the above-described load-lock chamber and a pump to reduce the pressure of the above-described load-load chamber is disposed in the above-described air line; and an accumulator capable of accumulating negative pressure is disposed in the above-described air line at the above-described pump side of the above-described opening and shutting valve.

(9) A vacuum processing apparatus includes: a vacuum transfer chamber whose interior can be maintained in a vacuum state or a pressure-reduced state; a plurality of vacuum processing chambers that are disposed adjacent to the above-described vacuum transfer chamber so as to communicate therewith or be isolated therefrom, and carry out prescribed processing on an object to be processed, in a vacuum state or a pressure-reduced state; a load-lock chamber, the interior pressure of which is reduced from the atmospheric pressure, that carries out receiving and transfer of the above-described object to be processed, between the outside and the above-described vacuum transfer chamber; and a transfer mechanism, which is provided in the above-described vacuum transfer chamber, receives the above-described object to be processed from the above-described load-lock chamber, and transfers the above-described object into the above-described plurality of vacuum processing chambers, and at the same time, moves the above-described object into the above-described load-lock chamber after prescribed processing is completed; wherein an accumulator mechanism, having at least one accumulator chamber that is able to be maintained in a vacuum state or a pressure-reduced state, which is able to accelerate reduction in pressure of the above-described load-lock chamber by negative pressure of the above-described accumulator chamber in the process of reducing the pressure inside the above-described load-lock chamber, is provided with respect to the above-described load-lock chamber.

(10) The vacuum processing apparatus according to (9) is featured in that the capacity of the above-described accumulator is made by 0.5 through 3 times greater than the capacity of the above-described load-lock chamber.

(11) A method for producing an object to be processed, which carries out prescribed processing in a vacuum state or a pressure-reduced state, using a vacuum processing apparatus is featured in including: a vacuum transfer chamber whose interior can be maintained in a vacuum state or a pressure-reduced state; a plurality of vacuum processing chambers that are disposed adjacent to the above-described vacuum transfer chamber so as to communicate therewith or be isolated therefrom, and carry out prescribed processing on an object to be processed, a load-lock chamber, the interior pressure of which is reduced from the atmospheric pressure, that carries out receiving and transfer of the above-described object to be processed, between the outside and the above-described vacuum transfer chamber; and a transfer mechanism, which is provided in the above-described vacuum transfer chamber, receives the above-described object from the above-described load-lock chamber, and transfers the above-described object into the above-described plurality of vacuum processing chambers, and at the same time, moves the above-described object into the above-described load-lock chamber after prescribed processing is completed; and comprising: a bypass line for connecting the above-described vacuum transfer chamber to the above-described load-lock chamber; and a bypass valve for opening and shutting the above-described bypass line; and further comprising the step of causing the above-described load-lock chamber to communicate with the above-described vacuum transfer chamber in a state where the above-described vacuum processing chambers are isolated from the above-described vacuum transfer chamber when the pressure of the above-described load-lock chamber is reduced from the atmospheric pressure to a prescribed pressure level.

(12) A method for producing an object to be processed, is featured in that comprising the steps of: conveying and carrying out an object to be processed, from a vacuum transfer chamber, the interior of which is able to be maintained in a vacuum state or a pressure-reduced state, to a plurality of vacuum processing chambers, which are disposed adjacent to the above-described vacuum transfer chamber so as to communicate therewith or be isolated therefrom and carry out prescribed processing with respect to the above-described object to be processed, in a vacuum state or a pressure-reduced state; receiving and transferring the above-described object between the outside and the above-described vacuum transfer chamber via a load-lock chamber, the interior pressure of which is reduced from the atmospheric pressure; wherein conveyance, carrying-out, receiving and transfer of the above-described object to be processed are executed by a transfer mechanism secured in the above-described vacuum transfer chamber, the above-described load-lock chamber is isolated from the vacuum transfer chamber when receiving the above-described object from the outside and transferring the same thereto, and is made open to the atmospheric air, and the above-described vacuum transfer chamber is interrupted from the atmospheric air when receiving the above-described object from the above-described vacuum transfer chamber and transferring the same thereto, and the interior pressure thereof is reduced, and the above-described object to be processed is conveyed to the above-described load-lock chamber after having executed prescribed processing on the above-described object to be processed with the above-described plurality of vacuum processing chambers made vacuum; and when the pressure of the above-described load-lock chamber is reduced from the atmospheric pressure to a prescribed stage, the above-described load-lock chamber is bypassed to the above-described vacuum transfer chamber in a state where the above-described vacuum processing chambers are isolated from the above-described vacuum transfer chamber.

(13) The method for producing an object to be processed, according to (12) is featured in that, at the stage where the pressure of the above-described load-lock chamber reaches the pressure required for the above-described vacuum transfer chamber in the bypassed state, a state where the above-described vacuum processing chambers are isolated from the above-described vacuum transfer chamber is cleared.

(14) The method for producing an object to be processed according to (12) is featured in that, at the stage where time considered for which the above-described load-lock chamber reaches pressure required for the above-described vacuum transfer chamber elapses in the bypassed state, a state where the above-described vacuum processing chambers are isolated from the above-described vacuum transfer chamber is cleared.

(15) The method for producing an object to be processed according to (12) is featured in that, immediately after prescribed processing is completed in the above-described vacuum processing chambers in the bypassed state, a state where the above-described vacuum processing chambers are isolated from the above-described vacuum transfer chamber is cleared.

(16) The method for producing an object to be processed according to (12) is featured in that, at the stage where time considered for which prescribed processing is completed in the above-described vacuum processing chambers elapses in the bypassed state, a state where the above-described vacuum processing chambers are isolated from the above-described vacuum transfer chamber is cleared.

(17) The method for producing an object to be processed according to any one of (12) to(16), wherein at least a-part of the above-described plurality of vacuum processing chambers is bypassed to the above-described load-lock chamber simultaneously with commencement of the bypassed state or immediately thereafter.

(18) The method for producing an object to be processed according to any one of (12) through (17) is featured in that negative pressure of an accumulator that is able to accumulate negative pressure is applied into the load-lock chamber when reducing the pressure of the above-described load-lock chamber.

According to the invention, it is possible to obtain a vacuum processing apparatus that, without accompanying a large increase in costs with a simple structure, is able to shorten the cycle time of respective processing while always maintaining the pressure of the vacuum transfer chamber and vacuum processing chambers at a low level, and is able to bring about high exhaust efficiency of the remaining gases.

DESCRIPTION OF THE PREFERRED EMBODIMENTS

Hereinafter, a detailed description is given of embodiments of the invention on the basis of the accompanying drawings.

Figure 1:
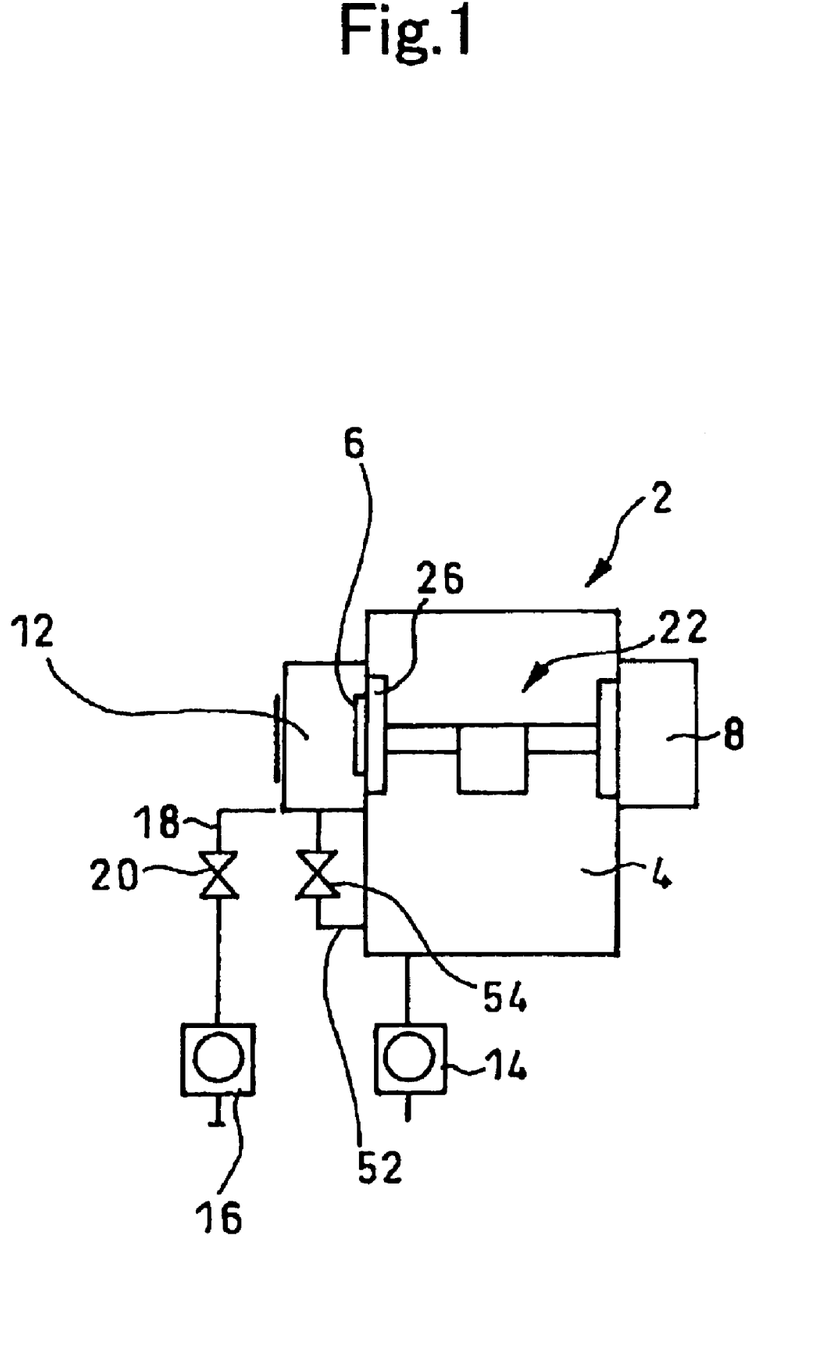
FIG. 1 is a roughly longitudinally sectional view schematically showing a vacuum processing apparatus according to the first embodiment of the present invention.

FIG. 1 shows a first embodiment of the invention.

A vacuum processing apparatus 50 according to the first embodiment has no special difference from the prior art vacuum processing apparatus 2 described above, other than the facility related to pressure reduction in the load-lock chamber and vacuum transfer chamber. Therefore, parts that are identical to those of the prior art vacuum processing apparatus are given the same reference numbers as those of the prior art vacuum processing apparatus, and overlapping description thereof is omitted. Herein, a detailed description is given of parts that are different from the prior art vacuum processing apparatus 2. This is the same as in the following embodiments.

A bypass line 52 is formed between a vacuum transfer chamber 4 and a load-lock chamber 12. Also, the bypass line 52 is provided with a bypass valve 54 that opens and shuts the corresponding bypass line 52.

That is, in the first embodiment, the vacuum transfer chamber 4 itself will be used as a so-called accumulator.

Figure 2:
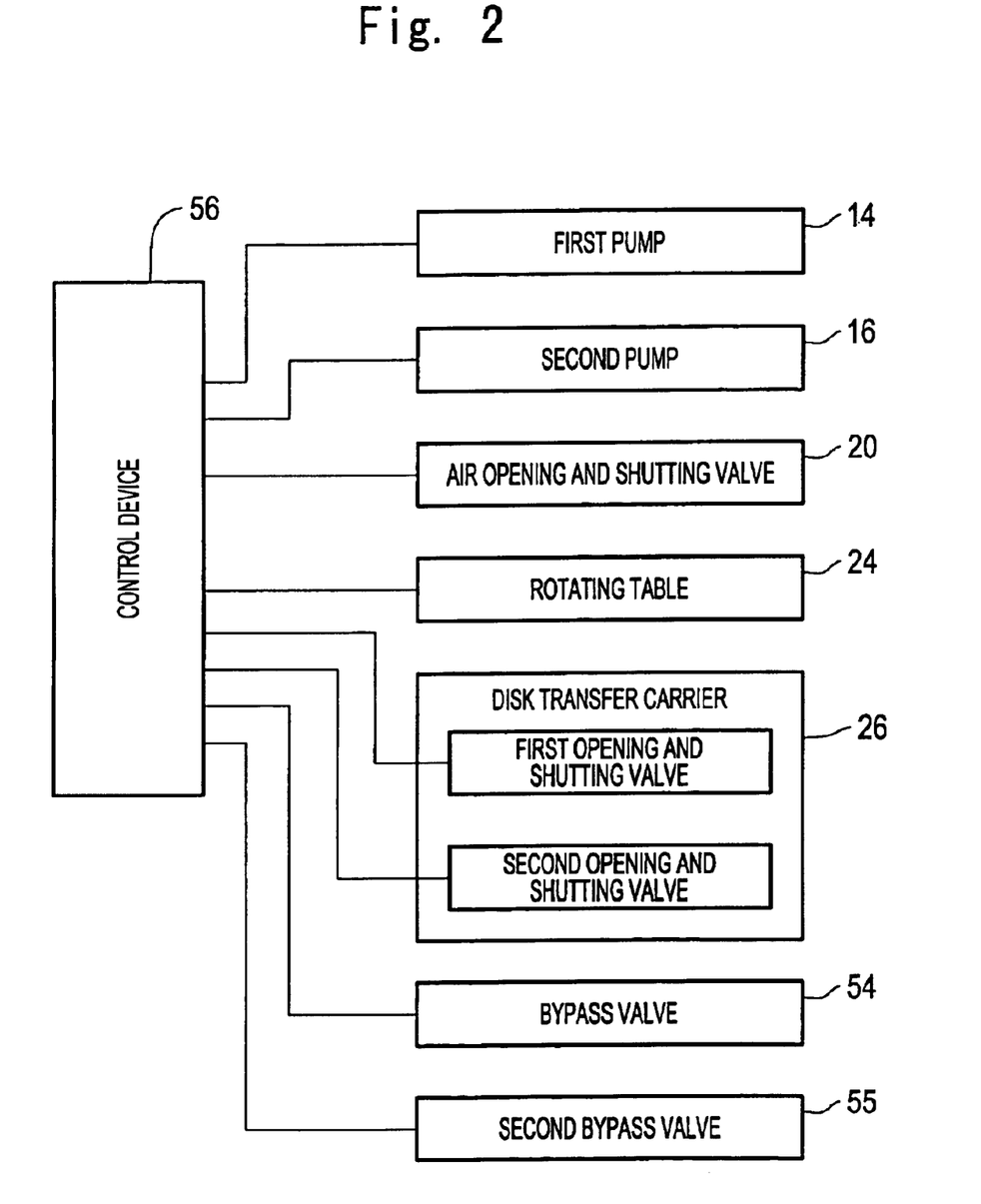
FIG. 2 is a block diagram showing a control system of the same vacuum processing apparatus.

At the stage when pressure reduction from the atmospheric pressure in the load-lock chamber 12 is progressed by a second pump 16 to such a degree that the pressure reduction does not impair a first pump 14 (that is, at the stage when the pressure is reduced to prescribed pressure P3, or the time T2 corresponding thereto elapses), the bypass valve 54 is opened. opening and shutting of the above-described bypass valve 54 are controlled by a control device 56 (Refer to FIG. 2). And, the control device 56 controls the first pump 14, the second pump 16, an air opening and shutting valve 20, and a transfer mechanism 22 (including a rotating table 24 and a disc transfer carrier 26), and is internally provided with a timer to open and shut a valve described later.

Also, with respect to the timing at which the vacuum transfer chamber 4 and vacuum processing chambers 8, which are isolated from each other, are caused to communicate with each other (that is, the timing for retreating the disc transfer carrier 26), it is possible to select two representative timings in design in response to objects (described in detail later) Next, a description is given of actions which are obtained by the above-described construction. That is, a description is given of a control process brought about by the control device 56. Also, the disc transfer carrier 26 is called the first opening and shutting valve when the load-lock chamber 12 and vacuum transfer chamber 4 are opened and shut, and is called the second opening and shutting valve when the vacuum transfer chamber 4 and vacuum processing chamber 8 are opened and shut.

As pressure reduction from the atmospheric pressure in the load-lock chamber 12 is caused to advance to some degree (that is, pressure P3 is reached or the time T2 corresponding to the pressure P3 after commencing the reduction elapses), the bypass valve 54 is opened. The pressure reduction shifts to a pressure-reduced state equivalent to pressure high vacuum level P1 at the vacuum transfer chamber 4 side at the moment when the bypass valve 54 is opened. Therefore, the pressure in the load-lock chamber 12 is reduced to pressure P4 that is remarkably lower than the pressure P2 in the prior art at once. Therefore, in comparison with the prior art construction in which the pressure of the load-lock chamber 12 is reduced by a function of only the second pump 16, it is possible to shorten the time required for reduction of pressure in the corresponding load-lock chamber 12.

In addition, since the first pump 14 for the vacuum transfer chamber 4 has a higher capacity than that of the second pump 16, it is possible to shorten the total cycle time because the first pump 14 can be used quickly. In the case of the same cycle time, a higher vacuum pressure environment can be achieved.

The construction does not require a new pump system at all, and does not need any higher performance pump. Many of the conventional components can be used as they are, wherein it is possible to prevent costs from being increased.

The pressure P4 of the vacuum transfer chamber immediately after the bypass valve 52 is opened by the bypass valve 52 is slightly higher than pressure P1 since a pressure-reduced state shifts to the load-lock chamber 12 side. However, since the respective vacuum processing chambers 8 are maintained to be airtight by the disc transfer carrier 26, which is concurrently used as the opening and shutting valve, the pressure of the vacuum processing chambers 8 will not rise beyond the pressure P1. Accordingly, no adverse effect due to an increase in the pressure of the vacuum transfer chamber 4 exerts on the processing in the corresponding vacuum processing chambers 8.

In addition, since the first opening and shutting valve is opened for the period during which the vacuum transfer chamber 4 and the load-lock chamber 12 connected thereto recovers from P4 to prescribed pressure P1, air is efficiently exhausted from the vacuum transfer chamber 4 by the first pump 14 at high speed (due to the existence of a greater amount of flown air than in the prior art because P3<P2), wherein the remaining gases can be smoothly exhausted (purged). The action is one of the most important actions of the present embodiment. A slight detailed description is given of the action below.

As a general theory, as the pressure of the load-lock chamber 12 is lowered from P2 in the prior art to P4, a rise in pressure (P1–P4) of the vacuum transfer chamber 4 is made small when a first opening portion 12A of the load-lock chamber 12 is opened to carry in and carry out a disc 6, and the pressure in the vacuum transfer chamber 4 is stabilized equivalent thereto. This in and of itself is favorable.

However, on the other hand, "Exhaust speed of pump" has a feature by which the further the pressure is drawn near the arrival pressure of the pump, the smaller the exhaust speed thereof becomes. Therefore, in a case where such stabilized pressure is maintained, a problem arises, by which the exhaust of the remaining gases is not rather smoothly performed. That is, it is not always most favorable, in view of exhausting the remaining gases of the vacuum transfer chamber 4, that the vacuum transfer chamber 4 is stable in a highly vacuum state where the pressure hardly changes.

However, in the present embodiment, a lowering (P2→P4) in the pressure of the load-lock chamber 12 is achieved not by strengthening the second pump but by causing the vacuum transfer chamber 4 and the load-lock chamber 12 to communicate with each other via the bypass line 54. For this reason, it is possible to cause a large amount of air to flow into the vacuum transfer chamber 4 on the basis of a greater pressure difference (P1–P3) than the pressure difference (P1–P2) in the prior arts by communication of the bypass line 54, wherein it is possible to exhaust the flown air together with the remaining gases by the first pump 14 (at a greater efficiency than in the prior arts).

When setting the timing for causing the vacuum transfer chamber 4 and the vacuum processing chambers 8, which are isolated from each other, to communicate with each other (that is, the timing for commencing the retreating of the disc transfer carrier 26 as the second opening and shutting valve), it is possible to select two types of timings in response to objects as described above. In either case, the following effects can be brought about.

One of the timings to be selected is "the time when the pressure level (initial value P4) of the load-lock chamber 12 and vacuum transfer chamber 4, which communicate with each other, reaches pressure P1 of high vacuum required for the corresponding vacuum transfer chamber 4 (or when the time considered at which the pressure is reached elapses)", and another timing thereof is "the time immediately after surface processing in the vacuum processing chambers 8 is completed after the communication is carried out (or when the time considered at which the surface processing is completed elapses)".

When the second opening and shutting valve is opened and the timing when the vacuum transfer chamber 4 and vacuum processing chambers 8, which are isolated from each other, are caused to communicate with each other is set to "the time when the pressure of the load-lock chamber 12 and vacuum transfer chamber 4 reaches pressure P1", even if the first opening portion 12A is opened, the pressure of the vacuum transfer chamber 4 will not rise from pressure P1 since the pressure of both the vacuum transfer chamber 4 and the load-lock chamber 12 reaches P1, wherein the pressure of the vacuum processing chambers 8 will not rise from pressure P1. Therefore, the disc 6 is placed in the surrounding of pressure P1 during the processing and transferring thereof.

Accordingly, higher quality processing can be carried out while shortening the total cycle time.

On the other hand, the timing when the vacuum transfer chamber 4 and vacuum processing chambers 8, which are isolated from each other, is set to "immediately after surface processing is completed in the vacuum processing chambers 8 after having communicated with each other", that is, "before the pressure of the load-lock chamber 12 and vacuum transfer chamber 4 reaches pressure P1 (or before the time considered when the pressure reaches pressure P1 elapses)", it is possible to restore the pressure to a prescribed pressure level P1 by utilizing the time during which the rotating table 24 turns by 90 degrees. Therefore, in this case, the cycle time can be further shortened.

Since air in the load-lock chamber 12 is caused to flow into not only the vacuum transfer chamber 4 but also the vacuum processing chamber 8 after surface processing is completed (during transferring of a disc 6), more efficient exhaust (purge) of the remaining gases can be carried out, including the vacuum processing chambers.

Also, the bypass valve 54 is shut at an optional timing until the first opening portion 12A of the load-lock chamber 12 is closed by again causing the disc transfer carrier 26 acting as the first opening and shutting valve to advance after the disc transfer carrier 26 commences retreating after prescribed processing is completed.

Figure 3:
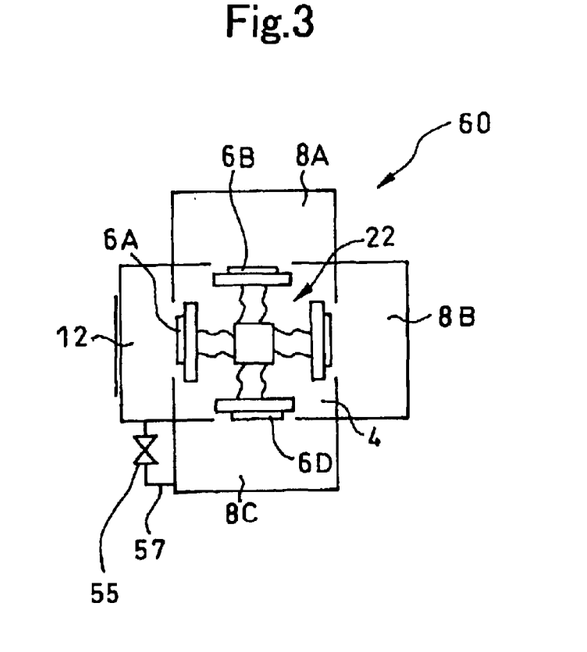
FIG. 3 is a roughly longitudinally sectional view schematically showing a vacuum processing apparatus according to the second embodiment of the present invention.

Next, a description is given of a second embodiment of the present invention shown in FIG. 3.

In a vacuum processing apparatus 60 according to the second embodiment, an idea for improving the exhaust efficiency (air purge efficiency) is further developed. For example, taking into consideration a case where particularly adverse remaining gases frequently occur in a specified vacuum processing chamber 8 (8C in the illustrated example), as shown in FIG. 3, a second bypass line 55 that causes the corresponding vacuum processing chamber 8C and load-lock chamber 12 to communicate with each other, and a second bypass valve 57 for opening and shutting the second bypass line 55 are disposed together with the bypass line 52 (not illustrated in FIG. 3) of the preceding embodiment. The second bypass line 55 is constructed so as to communicate with the load-lock chamber 12 simultaneously with or with a slight delay from opening of the bypass line 52.

Accordingly, the vacuum processing chamber 8C is caused to communicate with the load-lock chamber 12 (or the vacuum transfer chamber 4 connected to the load-lock chamber 12) quicker than other vacuum processing chambers 8A and 8B from an optional timing during surface processing (or immediately after surface processing) through both the bypass line 52 and the second bypass line 55, whereby the remaining gases of the corresponding vacuum processing chamber 8C can be exhausted or (purged), taking preference over the other vacuum processing chambers 8A and 8B.

The construction is effective in a case where adverse effects due to stoppage of the remaining gases in the corresponding vacuum processing chamber 8C are especially large. In addition, vacuum-processing chambers 8 to be connected may be provided in a plurality.

Figure 4:
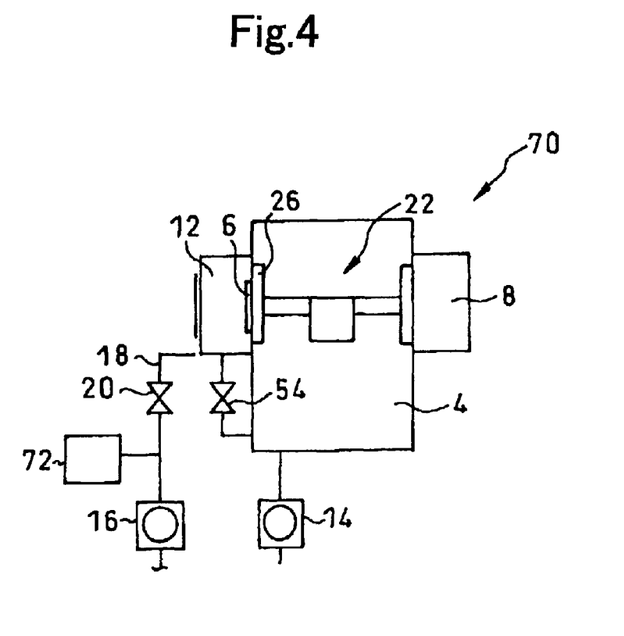
FIG. 4 is a roughly longitudinally sectional view schematically showing a vacuum processing apparatus according to the third embodiment of the present invention.

Next, a description is given of a third embodiment of the invention, which is shown in FIG. 4.

A vacuum processing apparatus 70 according to a third embodiment is such that, in the above-described vacuum processing apparatus 50, an accumulator chamber 72 is disposed at the second pump 16 side of the air opening and shutting valve 20 of an air line 18.

In the third embodiment, the accumulator mechanism constructed is composed of the air opening and shutting valve 20 of the air line 18 and the accumulator chamber 72.

Generally, the function of an accumulator is improved where the capacity of the accumulator chamber 72 is large. However, if the capacity is too large not only is the space of occupancy increased, but also the pressure-reduced state of the corresponding accumulator chamber 70 cannot be sufficiently improved in a prescribed duration of time, wherein the pressure reducing acceleration function of the load-lock chamber 12 is rather lowered. Therefore, it is preferable that the capacity of the accumulator is equal to 0.5 times through 3 times the substance internal capacity of the load-lock chamber 12.

The following actions can be brought about by providing the accumulator chamber 72.

That is, in the above-described vacuum processing apparatuses 50 and 60, while, in the above-described vacuum processing apparatuses 50 and 60, the first opening portion 12A is shut and a processed disc 6 is replaced for an unprocessed disc 6 in the atmospheric pressure, only the air opening and shutting valve 20 of the air line 18 is shut, and the second pump 16 does not stop but keeps rotating. This is because, even if instructions for the second pump 16 to rotate and stop are repeated once every cycle, the pressure of the load-lock chamber cannot be favorably reduced in an intended duration of time in view of its response feature.

In other words, this means that the second pump 16 is uselessly rotating at times other than when contributing to pressure reduction of the load-lock chamber 12.

To the contrary, in the construction according to the third embodiment, the pressure of the accumulator chamber 72 can be reduced by rotations of the second pump 16, utilizing the time during which the second pump 16 has conventionally been uselessly rotating. Therefore, it is possible to reduce the pressure of the load-lock chamber 12 to such a level that the above-described bypass valve 54 can be opened immediately after the air opening and shutting valve 20 is opened. Also, where the above-described construction is taken into consideration only in view of accelerating the pressure reduction of the load-lock chamber 12, if the construction of this section is embodied regardless of formation of the bypass line 52, the corresponding effect of accelerating the pressure reduction can be obtained.

In the construction according to the third embodiment, since the pressure reduction of the load-lock chamber 12 can be completed in a remarkably short time after the pressure reduction of the corresponding load-lock chamber 12 is commenced, the cycle time can be further shortened.

According to the present invention, it is possible to provide a vacuum processing apparatus that, with a simple construction and without accompanying a large increase in costs, is able to shorten the cycle times of respective processing under the condition of maintaining the pressure of a vacuum transfer chamber at a low level, and has a high exhaust effect.

What is claimed is:

1. A vacuum processing apparatus including:
   a vacuum transfer chamber whose interior can be maintained in a vacuum state or a pressure-reduced state;
   a plurality of vacuum processing chambers that are disposed adjacent to said vacuum transfer chamber so as to communicate therewith or be isolated therefrom, and carry out prescribed processing on an object to be processed, in a vacuum state or a pressure-reduced state;

a load-lock chamber, the interior pressure of which is reduced from atmospheric pressure, that carries out receiving and transfer of said object to be processed, between the outside and said vacuum transfer chamber; and a transfer mechanism, which is provided in said vacuum transfer chamber, which receives said object from said load-lock chamber, and transfers said object into said plurality of vacuum processing chambers, and at the same time, moves said object into said load-lock chamber after prescribed processing is completed;

a first pump maintaining the vacuum transfer chamber in the vacuum state or pressure-reduced state;

a second pump reducing the interior pressure of the load-lock chamber from the atmospheric pressure;

and further comprising:

a bypass line for connecting said vacuum transfer chamber to said load-lock chamber;

a bypass valve for opening and shutting said bypass line;

a first opening and shutting valve for opening and shutting between said load-lock chamber and said vacuum transfer chamber;

a second opening and shutting valve for opening and shutting between said vacuum processing chambers and said vacuum transfer chamber; and a control device controlling the bypass valve, the first pump, the second pump, the first opening and shutting valve and the second opening and shutting valve;

wherein the control device is constructed so as to open the bypass valve when the atmospheric pressure in said load-lock chamber is reduced to a prescribed level with said first opening and shutting valve closed, and cause said load-lock chamber and said vacuum transfer chamber to communicate with each other by said bypass valve and said bypass line in a state where said vacuum processing chambers are isolated from said vacuum transfer chamber by said second opening and shutting valve.

2. The vacuum processing apparatus according to claim 1, wherein the control device is constructed so as to open said second opening and shutting valve to clear a state where said vacuum processing chambers are isolated from said vacuum transfer chamber at the stage where the pressure of said load-lock chamber reaches prescribed pressure required for said vacuum transfer chamber after said bypass valve is opened.

3. The vacuum processing apparatus according to claim 1, wherein the control device is constructed so as to open said second opening and shutting valve to clear a state where said vacuum processing chambers are isolated from said vacuum transfer chamber at the stage where time considered for which said load-lock chamber reaches pressure required for said vacuum transfer chamber elapses after said bypass valve is opened.

4. The vacuum processing apparatus according to claim 1, wherein the control device is constructed so as to open said second opening and shutting valve to clear a state where said vacuum processing chambers are isolated from said vacuum transfer chamber, immediately after prescribed processing is completed in said vacuum processing chambers after said bypass valve is opened.

5. The vacuum processing apparatus according to claim 1, wherein the control device is constructed so as to open said second opening and shutting valve so as to clear a state where said vacuum processing chambers are isolated from said vacuum transfer chamber, at the stage where time considered for which prescribed processing is completed in said vacuum processing chambers elapses after said bypass valve is opened.

6. The vacuum processing apparatus according to claim 1, wherein said transfer mechanism is mainly composed of a rotating table and a plurality of transfer carriers that are attached to said rotating table so as to freely advance and retreat, and are able to hold and transfer said object to be processed, and said transfer carriers concurrently act as said first and second opening and shutting valves.

7. The vacuum processing apparatus according to claim 1, further comprising:

a second bypass line for causing a specified vacuum processing chamber of said plurality of vacuum processing chambers to communicate with said load-lock chamber; and a second bypass valve for opening and shutting said second bypass line;

wherein the control device is constructed so as to open said second bypass valve after said bypass line is opened to cause said second bypass line to communicate with said load-lock chamber.

8. The vacuum processing apparatus according to claim 1, further comprising: an opening and shutting valve for opening and shutting an air line between said load-lock chamber and a second pump is disposed in said air line; and an accumulator capable of accumulating negative pressure is disposed in said air line at said pump side of said opening and shutting valve;

wherein the control device is constructed so as to control the opening and shutting valve.

* * * * *